United States Patent
Hahn

(10) Patent No.: US 9,917,171 B2
(45) Date of Patent: Mar. 13, 2018

(54) LOW-RESISTIVE, CMOS-COMPATIBLE, AU-FREE OHMIC CONTACT TO N—INP

(71) Applicant: International Business Machines Corporation, Armonk, NY (US)

(72) Inventor: Utz Herwig Hahn, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/216,427

(22) Filed: Jul. 21, 2016

(65) Prior Publication Data

US 2018/0026111 A1   Jan. 25, 2018

(51) Int. Cl.
| | |
|---|---|
| *H01L 29/20* | (2006.01) |
| *H01S 5/343* | (2006.01) |
| *H01L 29/45* | (2006.01) |
| *H01L 21/285* | (2006.01) |
| *H01L 21/02* | (2006.01) |
| *H01S 5/042* | (2006.01) |

(52) U.S. Cl.
CPC ...... *H01L 29/452* (2013.01); *H01L 21/02543* (2013.01); *H01L 21/28518* (2013.01); *H01L 29/20* (2013.01); *H01S 5/0421* (2013.01); *H01S 5/0425* (2013.01); *H01S 5/343* (2013.01)

(58) Field of Classification Search
CPC ......... H01L 21/02543; H01L 21/28518; H01L 29/20; H01L 29/452; H01S 5/0421; H01S 5/0425; H01S 5/343
See application file for complete search history.

(56) References Cited

U.S. PATENT DOCUMENTS

| | | | |
|---|---|---|---|
| 5,430,327 | A | 7/1995 | Wu et al. |
| 6,858,522 | B1 | 2/2005 | Burton et al. |
| 8,466,555 | B2 | 6/2013 | Chelakara et al. |
| 8,946,780 | B2 | 2/2015 | Bahl et al. |
| 9,070,758 | B2 | 6/2015 | Van Hove |
| 2003/0168663 | A1* | 9/2003 | Slater, Jr. ............ H01L 21/0485 257/77 |

(Continued)

FOREIGN PATENT DOCUMENTS

JP   2015032631 A   2/2015

OTHER PUBLICATIONS

A. Firrincieli et al., Au-Free Low Temperature Ohmic Contacts for AlGaN/GaN Power Devices on 200 mm Si Substrates, 2013 International Conference on Solid State Devices and Materials, Fukuoka, 2013, pp. 914-915.

(Continued)

*Primary Examiner* — Stephen Bradley
*Assistant Examiner* — Long H Le
(74) *Attorney, Agent, or Firm* — Daniel P. Morris; Otterstedt, Ellenbogen & Kammer, LLP

(57) ABSTRACT

A device includes an n-doped InP layer and an ohmic contact, in contact with the n-doped InP layer. The ohmic contact includes an annealed stack of at least three, or preferably four alternating layers of Si and Ni, such that: (i) the n-doped InP layer and one of the layers of the stack in contact with the n-doped InP layer are at least partly intermixed; and (ii) any two adjacent layers of the stack are at least partly intermixed. Related fabrication methods are also disclosed.

16 Claims, 5 Drawing Sheets

(56) References Cited

U.S. PATENT DOCUMENTS

| | | | |
|---|---|---|---|
| 2003/0173571 A1* | 9/2003 | Kish, Jr. | B82Y 20/00 257/85 |
| 2008/0121895 A1* | 5/2008 | Sheppard | H01L 21/26553 257/76 |
| 2008/0230802 A1* | 9/2008 | Bakkers | B82Y 10/00 257/190 |
| 2010/0102331 A1* | 4/2010 | Fujikawa | H01L 21/0485 257/77 |
| 2012/0126250 A1* | 5/2012 | Tamaso | H01L 21/046 257/77 |
| 2013/0082285 A1* | 4/2013 | Kudou | H01L 29/0619 257/77 |
| 2014/0307997 A1 | 10/2014 | Bar et al. | |
| 2014/0346568 A1 | 11/2014 | De Jaeger | |
| 2015/0364330 A1 | 12/2015 | Chen | |

OTHER PUBLICATIONS

Nguyen, A., et al. "Formation of a low ohmic contact nickel silicide layer on textured silicon wafers using electroless nickel plating." Proc. of the 25th EPVSEC (2010): 2672-2675.

* cited by examiner

LOW-RESISTIVE, CMOS-COMPATIBLE, AU-FREE OHMIC CONTACT TO N—INP

BACKGROUND

The invention relates in general to devices involving ohmic contacts to n-doped InP layers. In particular, it is directed to devices comprising low-resistive, Au-free ohmic contacts obtained by annealing a stack of alternating layers of silicon and nickel. Such contacts can notably be used to inject current into components based on III-V semiconductors. Embodiments of the present invention can therefore find applications in the field of optical amplifier devices and silicon photonic circuit devices.

Silicon photonics relate to photonic systems, where silicon is used as medium for light propagation because of the material's low optical loss. Silicon photonics makes use of well-established silicon manufacturing principles exploited in complementary metal-oxide semiconductor (CMOS) electronics. The features are usually patterned into microphotonic components with sub-micron precision (to operate in the infrared). Silicon on insulator (SOI) is typically used as a material of choice. The fabrication of silicon photonic devices can otherwise involve known semiconductor fabrication techniques; since silicon is already used as a substrate of choice for most integrated circuits, it is possible to create hybrid devices in which the optical and electronic components are integrated onto a single chip.

Integrated optical interconnects with compatible light sources are needed for mass-fabrication of low-cost, high-performance CMOS-based chips. Due to the indirect band gap of silicon, no Si-based light source is available. Efficient light sources are typically based on III-V semiconductors which are heterogeneously or hybrid integrated on a Si photonics platform.

The successful monolithic integration of components such as III-V semiconductor lasers on silicon requires shallow components, e.g., III-V gain stacks of less than 500 nm. Furthermore, the contact layers for injecting current need be moderately doped. This is necessary to achieve low absorption losses and thereby preserve the actual lasing action. On the other hand, moderately doped contact layers do usually not allow for low specific contact resistivities, i.e., specific contact resistivities of less than $10^{-6}$ $\Omega \cdot cm^2$. A low contact resistance, however, is desired to reduce power dissipation. This is for instance needed to reduce thermal dissipation of an integrated laser and, in turn, increase its efficiency, by consuming less energy and having less thermal footprint.

SUMMARY

According to a first aspect, the present invention is embodied as a device comprising an n-doped InP layer and an ohmic contact, in contact with the n-doped InP layer. Said ohmic contact comprises an annealed stack of at least three alternating layers of Si and Ni, wherein adjacent layers are at least partly intermixed. Namely, the n-doped InP layer and one of the layers of the stack in contact therewith are at least partly intermixed. In addition, any two adjacent layers of the stack are at least partly intermixed.

In embodiments, the stack is an annealed stack of at least, or exactly, four alternating layers of Si and Ni, any two adjacent layers of which are at least partly intermixed. The four layers may for instance successively comprise: a first layer of Ni, on top of and in contact with the n-doped InP layer; a second layer of Si, on top of and in contact with the first layer, a third layer of Ni on top of and in contact with the second layer and a fourth layer of Si on top of and in contact with the third layer.

Preferably, the first layer and the second layer have, each, an average thickness that is substantially less than an average thickness of each of the third layer and the fourth layer.

In preferred embodiments, the device comprises two ohmic contacts, each according to said ohmic contact, whereby each of the two ohmic contacts is in contact with the n-doped InP layer.

Preferably, the device further comprises a component having a layered structure, in electrical contact with said n-doped InP layer, wherein said component is one of: an optoelectronic component, a photonic component or an electronic component. This component may for example be an active gain material layer stack, comprising an epitaxially-grown stack of III-V semiconductor material layers, on top of and in contact with said n-doped InP layer, in which case the device further comprises a p-doped InP layer on top, in contact with a top layer of the active gain material layer stack. The latter is arranged between said two ohmic contacts.

According to another aspect, the invention is embodied as a method of fabrication of a device according to embodiments as discussed above. The method first comprises providing an n-doped InP layer. Then, a stack of at least three alternating layers of Si and Ni is grown, such that one of the at least three layers is in contact with the n-doped InP layer. Finally, the device is annealed, in such a way that: (i) the n-doped InP layer and one of the layers of the stack in contact therewith are at least partly intermixed; and (ii) any two adjacent layers of the stack are at least partly intermixed.

In embodiments, the stack grown comprises four alternating layers of Si and Ni, such that one of the four layers in contact with the n-doped InP layer is a layer of Ni. In addition, the annealing is carried in two steps. During a first annealing step, the device is annealed at a first temperature that is between 220 C and 300 C, so as for said one of the four layers in contact with the n-doped InP layer to react therewith and form a region comprising a NiInP compound. During the second annealing step, the device is annealed at a second temperature that is higher than said first temperature and lower than or equal to 450 C. Eventually, any two adjacent layers of the stack are at least partly intermixed.

Devices and fabrication methods embodying the present invention will now be described, by way of non-limiting examples, and in reference to the accompanying drawings.

BRIEF DESCRIPTION OF THE DRAWINGS

FIG. 9 depicts the final device, according to embodiments.

Figure 1:
FIGS. 1-9 are 2D cross-sectional views illustrating the fabrication of a device, according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

Figure 9:
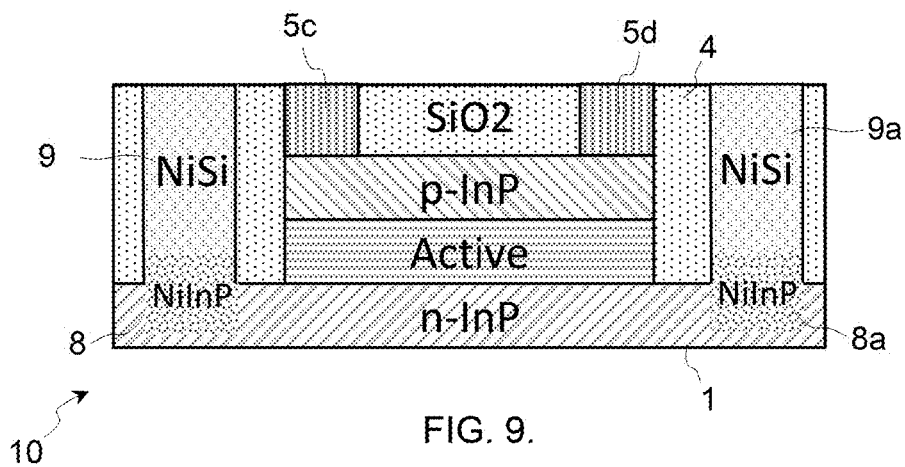
Figure 10:
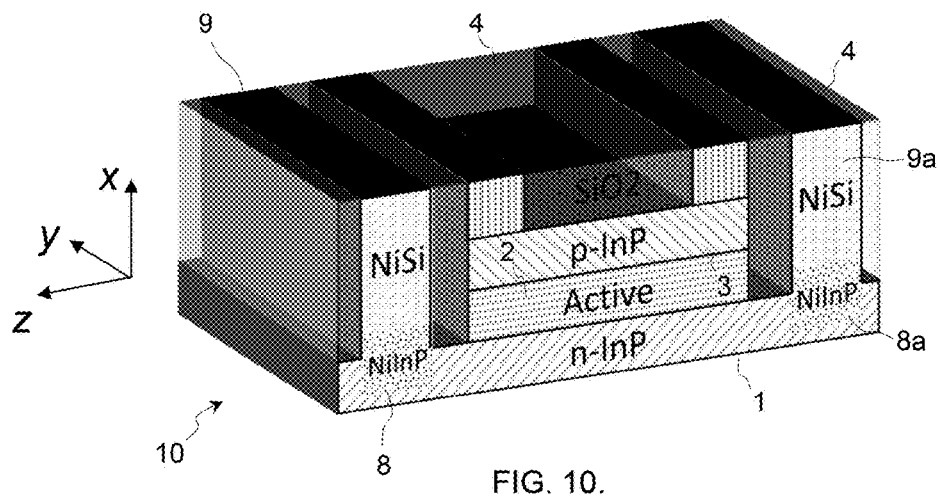
FIG. 10 shows a 3D view of the device of FIG. 9, also showing a cut-away portion thereof.

In reference to FIGS. 9 and 10, an aspect of the invention is first described, which concerns a device 10 that may for instance be an electronic device or an opto-electronic device. Basically, this device 10 comprises an n-doped InP layer 1 (i.e., a layer that essentially comprises n-InP) and an ohmic contact 8, 9. The ohmic contact 8, 9 is in mechanical contact (and thus in electrical contact) with the n-doped InP layer 1. This ohmic contact 8, 9 comprises a stack 6 (see FIG. 6) of at least three alternating layers 61-64 of silicon (Si) and nickel (Ni), i.e., layers that essentially comprise Si or Ni. Such layers 61-64 may have different thicknesses.

This stack 6 (or, in fact, the whole device 10) has been subject to an annealing process, such that the n-doped InP layer 1 and the lower layer 61 of the stack 6 (in contact with the n-doped InP layer 1) are at least partly intermixed. In addition, and due to this annealing, any two adjacent layers of the stack 6 are at least partly intermixed. The intermixing may even extend to second-neighbor layers, e.g., cause Si diffuse into the lower InP layer 1.

Figure 7:
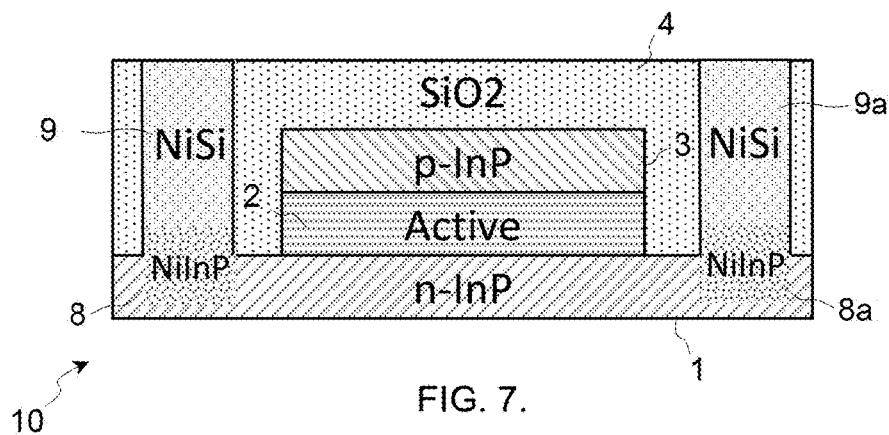
Figure 8:
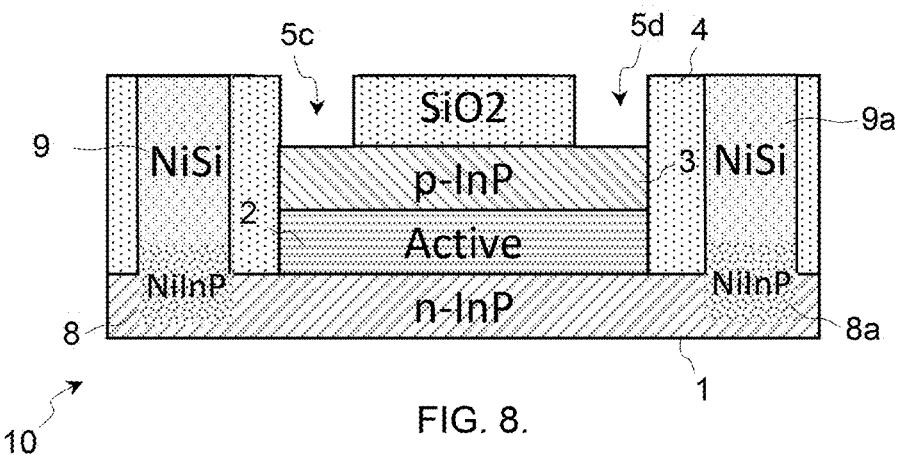

Thus, the annealing process employed eventually leads to more or less distinguishable layers. For instance, assuming that the layer sequence starts with a Ni layer 61, two limiting cases can be considered. First, if the intermixing remains moderate, the layers 61-64 will be only partly intermixed and a diffuse interface is expected to be seen between any two consecutive layers. However, the intermixing may be more pronounced, in which case the layers will be strongly intermixed. For example, and as depicted in FIG. 7, the contact obtained may roughly pass from a lower region 8 that essentially comprises a mixture of Ni, In and P (owing to the intermixing of layers 1 and 61) to an upper region 9 that essentially comprises a mixture of Ni and Si (due to the intermixing of layers 62-64). In both cases, the atomic density profiles eventually obtained may nevertheless slightly vary along the vertical axis x (the stacking direction), in accordance with the initial (i.e., pre-annealing) stack 6 of layers 61-64. Also, in both cases, Si may diffuse into the InP layer 1, which increases the doping level.

The present devices 10 allow an Au-free ohmic contact to be obtained on moderately-doped n-InP layer. Having an Au-free contact makes it compatible with CMOS technology. Notwithstanding, the above structure may lead to very low specific contact resistivities, e.g., of less than $10^{-6}$ or even $10^{-7}$ $\Omega \cdot cm^2$. In fact, specific contact resistivities obtained with the present approach may typically be on the order of $10^{-8}$ $\Omega \cdot cm^2$, or even less. In other words, the resistance may be lowered by up to two orders of magnitude compared with prior art approaches. Such performances are perceived to result from the components used (Si and Ni), the number of layers relied on (at least three, preferably four, or more) and the intermixing of the alternating layers in the ohmic contact stack, as obtained by annealing. In particular, the annealing may notably cause Si atoms to diffuse into the lower region 8 that forms at the bottom of the ohmic contact stack and increase the doping level thereat. This, in turn, makes it possible to lower absorption losses, which, in embodiments, can advantageously be exploited to avoid suppressing the lasing action.

Although improved ohmic contact stacks can in principle be obtained with three alternating layers only, present inventor have observed that better results can be obtained with stacks of four layers or more. Thus, in embodiments, the stack 6 is formed from at least four alternating layers 61-64 of Si and Ni, where any adjacent pair of layers become at least partly intermixed.

Increasing the number of initial layers 61-64 provides additional control for the annealing process and the resulting intermixing. This, however, also increases the fabrication complexity. A satisfactory trade-off is to limit the stack 6 to exactly four alternating layers 61-64 of Si and Ni.

The sequence of alternating layers 61-64 may, in principle, start with Si as a first layer 61. Yet, present Inventors have obtained better results, in terms of resistances, with layer sequences starting with Ni. Therefore, in embodiments, the stack 6 first comprises a first layer 61 of Ni, on top of the n-doped InP layer 1 and in direct contact therewith. A second layer 62 of Si is grown on top of (and in contact with) the first layer 61 of Ni. A third layer 63 of Ni is provided on top of and in contact with the second layer 62 and a fourth layer 64 of Si is on top of and in contact with the third layer 63, and so on. Preferably, the stack 6 stops at layer 64, as assumed in the embodiments of FIGS. 5-10.

The first layer 61 and the second layer 62 preferably have, each, an average thickness that is substantially less than an average thickness of each of the third layer 63 and the fourth layer 64. Using thin lower layers 61, 62 allows the lower Ni layer 61 to react well with the InP layer 1, during the annealing process, and form a low-resistive NiInP region 8. Yet, using thin lower layers 61, 62 makes it possible for Si to diffuse into the lower region 8, to increase the doping level, as noted earlier. The upper layers 63, 64 of Ni and Si form a low-resistive alloy NiSi which acts as a contact plug.

Quantitatively, it appears advantageous for the first layer 61 and the second layer 62 to have, each, an average thickness that is equal to or less than ⅛ of the average thickness of the third layer 63 and the fourth layer 64. For example, the thickness of each of the first layer 61 of Ni and the second layer 62 of Si may be chosen to be approximately 3 nm, whereas the thickness of each of the third layer 63 of Ni and the fourth layer 64 of Si may be 24.5 or 25 nm, as measured along the stacking direction x. Such values are subject to an accuracy, which may reach ±1 nm, depending on the method used to measure it. The above values notably allow a ratio of Ni to Si that is substantially of 1:1 in the stack 6, which appears to favorably impact the resistance of the contact (this ratio appears to result in the lowest resistance for the metal pad). Yet, satisfactory results have already been obtained using an average thickness for the layers 61, 62 equal to or less than ⅕ of the average thickness of the layers 63, 64.

In general, one may seek to limit the height of the stack 6, e.g., to less than 80 nm (as measured along said stacking direction x), to allow for integration of shallow devices 10. In that respect, one may further limit the thicknesses of the first layer 61 and the second layer 62, e.g., to a value equal to or less than 1/10 of the average thickness of the third layer 63 and the fourth layer 64. This way, specific contact resistivities of less than $10^{-7}$ or, even, less than $10^{-8}$ $\Omega \cdot cm^2$ could be obtained.

As assumed in the embodiments of FIGS. 5-10, the present devices 10 preferably comprise more than one, e.g., two ohmic contacts 8, 9; 8a, 9a, that are, each, configured in a similar fashion as described above. Namely, each of the contacts 8, 9; 8a, 9a is in (direct) contact with the n-doped InP layer 1 and comprises an annealed stack 6, 6a of alternating layers 61-64, 61a-64a.

Any number of ohmic contacts may be used, e.g., as necessary to establish electrical communication with components 2 of the device 10. In particular, the present devices 10 may comprise a component 2 having a layered structure and arranged in electrical contact with the n-doped InP layer 1. The component 2 may for instance be arranged between the two ohmic contacts 8, 9; 8a, 9a, for compactness, as depicted in FIGS. 5-10.

This component 2 may notably be an optoelectronic component, a photonic component or an electronic component. If this component 2 is an optoelectronic or a photonic component, then the device 10 will likely comprise a cladding material 4, such as $SiO_2$, covering the structure, so as for the component 2 and the two ohmic contacts 8, 9; 8a, 9a to be partly imbedded in the cladding material 4, as depicted in FIG. 9.

Figure 11:
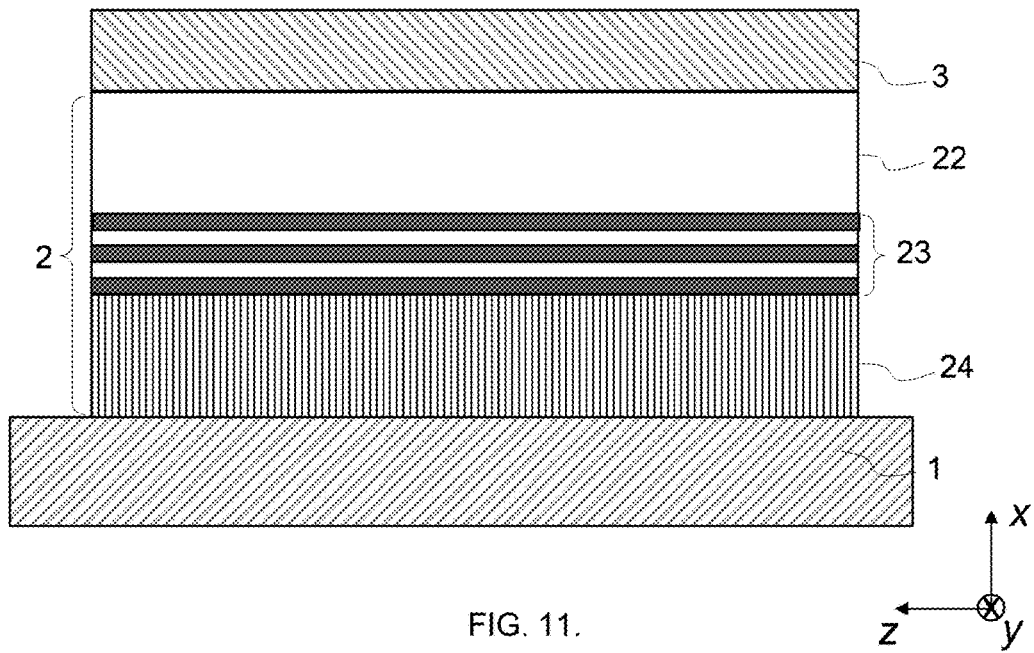
FIG. 11 is a 2D cross-sectional view of an active gain material layer stack, comprising an epitaxially grown stack of III-V semiconductor material layers, as involved in embodiments.

Referring now more specifically to FIG. 11, in embodiments, this component 2 may notably be an active gain material layer stack 2, which comprises an epitaxially-grown stack of III-V semiconductor material layers 22-24. This stack 2 is grown on top of and in contact with the n-doped InP layer 1. A p-doped InP layer 3 is further provided on top and in contact with a top layer 22 of the active gain material layer stack 2. The stack 2 is typically arranged between said two ohmic contacts 8, 9; 8a, 9a, as depicted in FIGS. 7-10 and may form a III-V laser, together with layers 1 and 3.

The resulting structure 1-3 may be monolithically integrated on Si. I.e., it may be bonded directly onto a wafer (not shown), using molecular bonding or a layer of polymer or SiO2 or, still, a bilayer of Al2O3 and SiO2 or a combination thereof. However, using a bilayer of Al2O3 and SiO2 is preferred because SiO2 is a standard material in CMOS processes and Al2O3 improves the bonding energy. Tapered waveguide core portions (not shown) may be patterned on top of the cladding material 4, to ensure in- and out-coupling of light. The dielectric layers on top and bottom of the structure 1-3 may be adapted to tune the mechanical and thermal properties of the device 10.

The device 10 may notably be embodied as a photonic circuit device. The latter may comprise a CMOS front-end-of-line (FEOL) or a bipolar CMOS FEOL. For example, the photonic circuit device may comprise a wafer and a buried oxide layer, with electronics on top and passive photonics. The wafer is preferably a silicon wafer but may also be made from Gallium Arsenide (GaAs) or Indium Phosphide (InP).

The structure 1-3, including the gain stack 2 is now described in more detail, in reference to FIG. 11, which notably depicts a sectional view of the epitaxial layer stack of III-V semiconductor material layers 22-24. The gain stack 2 may notably comprise:

A first intrinsic semiconductor 24, arranged on top of the n-doped semiconductor layer 1;
A multiple quantum well section 23 on top of the first intrinsic semiconductor 24; and
A second intrinsic semiconductor 22 on top of the multiple quantum well section 23. In variants, two layers may be used, instead of one. Namely, the two layers may include a separate confinement heterostructure and an electron blocking layer.

Note that the terminology "intrinsic semiconductor" as used above actually means "unintentionally doped semiconductor". That is, the doping level of the semiconductor material is essentially determined by its fabrication (e.g., growth conditions, precursor material chosen, etc.), rather than by intentionally adding doping species.

The p-doped semiconductor 3 completes the structure 1-3 on top of the second intrinsic semiconductor 22. In addition, another contact layer may be provided on top, to contact the p-doped layer, as usual.

The above layer stack 1-3 is easy to grow, e.g., by molecular beam epitaxy (MBE) or by metal-organic chemical vapor deposition (MOCVD). The semiconductor materials 1, 22, 23, 24 and 3 can be doped, if necessary, and preferably in conjunction with strain, e.g., to tune the bandgap.

Figure 12:
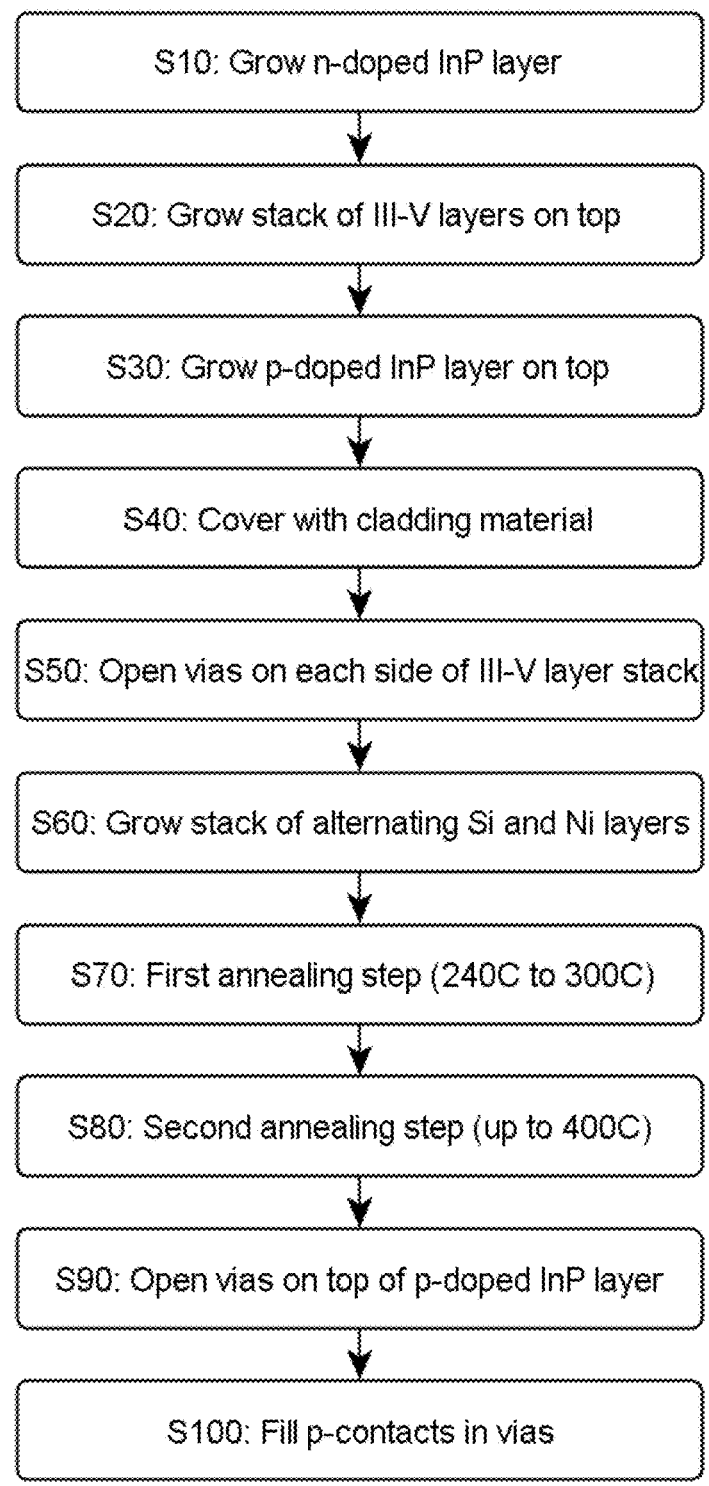
FIG. 12 is a flowchart representing high-level steps of fabrication of a device, according to embodiments.

Referring now to FIG. 12, another aspect of the invention is described, which concerns a method of fabrication of a device 10 such as described above. Essentially, this method relies on the following steps:

First, an n-doped InP layer 1 is provided, step S10 (FIG. 12), as otherwise depicted in FIG. 1;
Then, one or more stack 6, 6a of alternating layers 61-64 of Si and Ni are grown on this layer 1, such that a lower layer 61, 61a of the stack is in contact with the n-doped InP layer 1, step S60, see also FIG. 5. As explained earlier, each stack 6, 6a comprises at least three layers of Si and Ni. Yet, it preferably comprises four (or more) alternating layers 61-64; and
Next, and as explained further below, the device 10 is annealed, steps S70, S80, see also FIGS. 6-7. The annealing may be made local (e.g., by laser annealing)), such that only the stacks 6, 6a are subject to annealing (or restricted portions of the device 10), so as to not damage other parts 2 of the device 10, if necessary. Yet, the whole device may be subjected to the annealing procedure, the other components permitting.

As a result of this annealing process: the n-doped InP layer 1 and the lower layer 61, 61a of each stack 6, 6a in contact therewith will be at least partly intermixed. In addition, any two adjacent layers of the stack 6, 6a are at least partly intermixed, as explained earlier in reference to FIGS. 9, 10.

In preferred embodiments, each stack 6, 6a comprises exactly four alternating layers 61-64 of Si and Ni and starts with a Ni layer 61, 61a, which is thus in direct contact with the n-doped InP layer 1, as discussed earlier.

Figure 6:
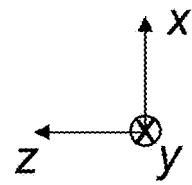
Figure 6:
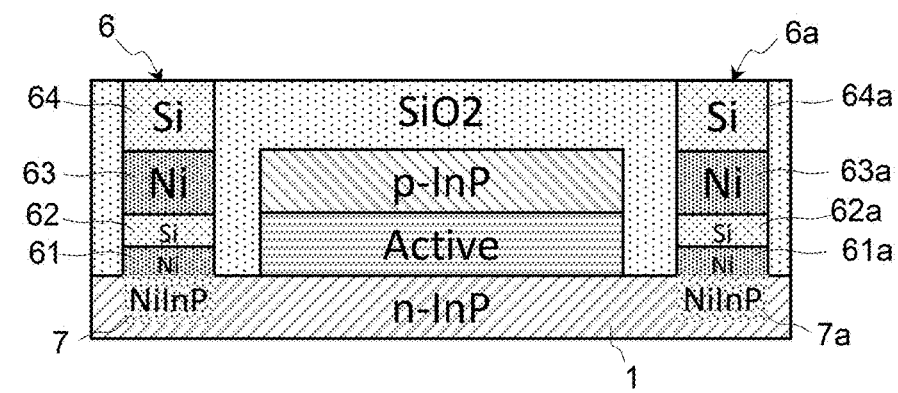

The annealing process is preferably carried out in two steps S70, S80. For instance:

A first annealing step may be performed S70, FIG. 6, during which the device 10 is heated at a first temperature between 220 C and 300 C. As a result, the lower layers 61, 61a in contact with the n-doped InP layer 1 react therewith and form a region 8 comprising a NiInP compound.
A second annealing step is then carried out S80, FIG. 7, during which the device 10 is heated at a second temperature, which is higher than the first temperature. Still, this second temperature need typically be lower than or equal to 450 C. This way, the temperature safely remains below 500 C, at which temperature phosphorous may otherwise typically desorb from the InP lattice. In variants, short anneals (e.g., short heating pulses) may be relied on, possibly above 500 C. Yet, the inventor observed that temperatures above 450 C tend to degrade the contact. However, using an annealing temperature of about 350 C systematically resulted in the lowest contact resistances, according to tests performed by the Inventor. Typical annealing durations are, for each step, between 10s and 600s. The duration is preferably of 100s for the first step and of 300s for the second step. As a result, adjacent layers of the stack 6, 6a become at least partly intermixed.

Figure 2:
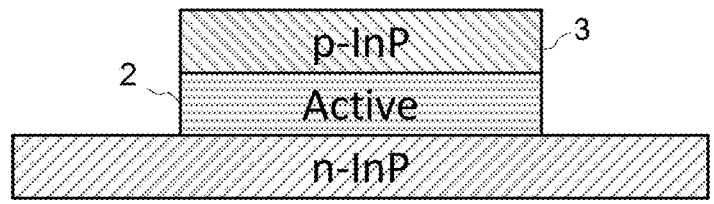

In embodiments involving III-V gain sections, a stack 2 of III-V semiconductor material layers are grown on top and in contact with the n-doped InP layer 1, step S20, FIG. 2 and, this, prior to growing S60 the stacks 6, 6a. After step S20, a p-doped InP layer 3 can be grown on top and in contact with the top layer 22 of the stack 2, step S30, FIG. 2. Then, the n-doped InP layer 1 and the p-doped InP layer 3 may be covered with a cladding material 4, step S40, FIG. 3. Finally, one may open vias or trenches 5, 5a in the cladding material on each side of the stack 2, step S50, see also FIG. 4. The stacks 6, 6a of alternating layers can subsequently be grown in respective vias 5, 5a, step S60, see FIG. 5.

Upon completion of the annealing process S70-S80, p-contacts 12, 12a can be fabricated by first opening vias 5b, 5c, step S90, and then filling S100 the vias 5b, 5c with any suitable metal to form the two p-contacts 12, 12a. In variants (not shown), only one p-contact may be fabricated on top of layer 3. In addition, we note that depending on the contact annealing scheme chosen, the p-contacts 12, 12a may be fabricated before or after fabricating the n-contacts, i.e., either before step S50 (whereby the p-contacts 12, 12a are subject the annealing S70-S80) or after step S80, as assumed above. In the latter case, the p-contacts may nevertheless be subject to an annealing process, after step S100. Other variants can be contemplated.

Figure 3:
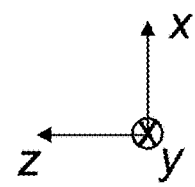
Figure 3:
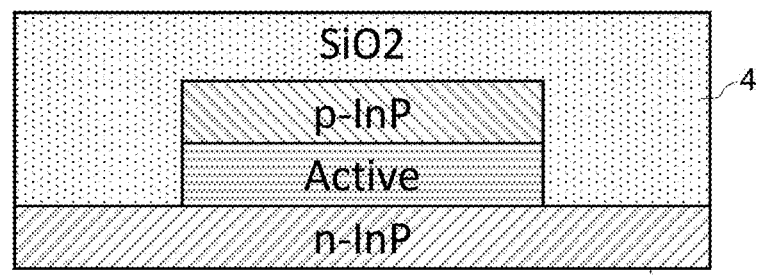
Figure 4:
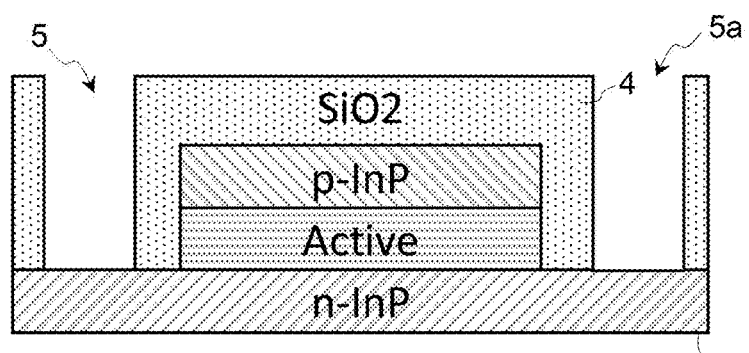
Figure 5:
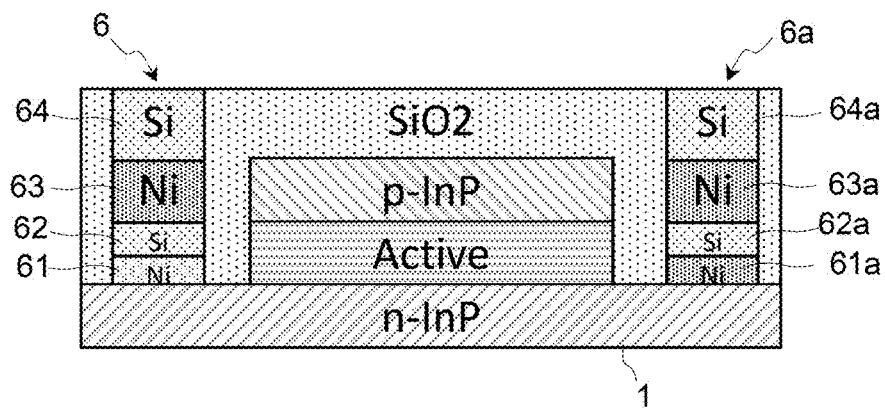

The above embodiments have been succinctly described in reference to the accompanying drawings and may accommodate a number of variants. Several combinations of the above features may be contemplated. For example, in particularly preferred embodiments, an epitaxially grown stack 2 is used, which is structured as shown in FIGS. 3 and 11. I.e., the stack 2 is grown onto an n-doped InP layer 1. The active region 2 includes multi-quantum wells 23 (FIG. 11). The latter may notably involve any form of $In_xAl_yGa_{1-x-y}As$, with $0 \le x \le 1$ and $0 \le y \le 1$. In variants, InGaAsP (or InAlAsP or AlGaAsP) may be used. A layer of p-doped InP 3 completes the structure, which is fully covered by an insulator, such as $SiO_2$, FIG. 3. The $SiO_2$ is then opened, FIG. 4, and the ohmic contact layer (Ni/Si/Ni/Si) stacks are deposited (e.g., sputtered or e-beam evaporated) and structured (e.g., RIE etched, or Ion Beam Milling etched), FIG. 5. The total layer thickness is of about 75 nm. The ratio Ni to Si is approximately 1:1 and the lower layers 61, 62, 61a, 62a are very thin, i.e., approximately 3 nm each. The structure 1-3 is then annealed in two steps. During the first annealing (in a temperature range of 220 C to 300 C), the lower Ni layer 61, 61a reacts with the neighboring InP layer 1 to form a low-resistive compound 7, 7a of NiInP (Si may further diffuse into this InP to increase the doping level), FIG. 6. A preferred temperature for this first step is 240 C. The second annealing is performed at a higher temperature (up to 450 C), so as for the upper layers 63, 64, 63a, 64a of Ni and Si to form a low-resistive alloy NiSi which acts as contact plugs 9, 9a, FIG. 7. During the second annealing step, the lower regions 7, 7a (low-resistive compounds of FIG. 6) expand somewhat, due to continued intermixing of layers 1 and 61, to form lower regions 8, 8a (FIG. 7). The process is completed by fabricating upper p-contacts 12, 12a as described above in reference to steps S90, S100 of FIG. 12.

The contacts 8, 8a, 9, 9a finally obtained were tested with suitable test structures (relying on transfer length methods) and median specific contact resistivities below $10^{-7}$ $\Omega \cdot cm^2$ were achieved. In some cases, specific contact resistivities below $10^{-8}$ $\Omega \cdot cm^2$ were achieved.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other cladding materials than $SiO_2$ may be used.

What is claimed is:

1. A device comprising:
   an n-doped InP layer; and
   an ohmic contact, in contact with the n-doped InP layer, wherein the ohmic contact comprises an annealed stack of at least a first layer of Ni on top of and in contact with the n-doped InP layer, a second layer of Si on top of and in contact with the first layer, a third layer of Ni on top of and in contact with the second layer, and a fourth layer of Si on top of and in contact with the third layer,
   wherein
   the first layer and the second layer have, each, an average thickness that is substantially less than ⅕ an average thickness of each of the third layer and the fourth layer;
   the n-doped InP layer and one of the layers of the stack in contact therewith are at least partly intermixed; and
   any two adjacent layers of the stack are at least partly intermixed.

2. The device according to claim 1, wherein the first layer and the second layer have, each, an average thickness that is equal to or less than ⅛ of the average thickness of the third layer and the fourth layer.

3. The device according to claim 1, wherein the ratio of Ni to Si in the annealed stack is substantially of 1:1.

4. The device according to claim 3, wherein a specific contact resistivity of the ohmic contact is less than 10-7 $\Omega \cdot cm^2$.

5. The device according to claim 3, wherein a specific contact resistivity of the ohmic contact is less than 10-8 $\Omega \cdot cm^2$.

6. The device according to claim 1, wherein a height of the stack is less than 80 nm as measured along a stacking direction thereof.

7. The device according to claim 6, wherein:
   a thickness of each of the first layer of Ni and the second layer of Si is 3 nm;
   a thickness of the third layer of Ni is 25 nm; and
   a thickness of the fourth layer of Si is 25 nm,
   as measured along the stacking direction.

8. The device according to claim 1, wherein a specific contact resistivity of the ohmic contact is less than 10-6 $\Omega \cdot cm^2$.

9. The device according to claim 1, comprising two ohmic contacts, each according to the ohmic contact, whereby each of the two ohmic contacts is in contact with the n-doped InP layer.

10. The device according to claim 9, further comprising a component having a layered structure, in electrical contact with the n-doped InP layer, wherein the component is one of:

an optoelectronic component;
a photonic component; and
an electronic component.

11. The device according to claim 10, wherein:
the component is an active gain material layer stack, comprising an epitaxially-grown stack of III-V semiconductor material layers, on top of and in contact with the n-doped InP layer; and
the device further comprises a p-doped InP layer on top and in contact with a top layer of the active gain material layer stack,
wherein the p-doped InP layer is arranged between the two ohmic contacts.

12. The device according to claim 10, wherein the device comprises a cladding material, each of the component and the two ohmic contacts partly imbedded in the cladding material, the active gain material layer stack arranged between the two ohmic contacts.

13. A method of fabrication of a device comprising an n-doped InP layer and an ohmic contact, in contact with the n-doped InP layer, the method comprising:
providing the n-doped InP layer;
growing a stack of at least a first layer of Ni on top of and in contact with the n-doped InP layer, a second layer of Si on top of and in contact with the first layer, a third layer of Ni on top of and in contact with the second layer, and a fourth layer of Si on top of and in contact with the third layer, wherein the first layer and the second layer have, each, an average thickness that is substantially less than ⅕ an average thickness of each of the third layer and the fourth layer; and
annealing the device such that:
the n-doped InP layer and one of the layers of the stack in contact therewith are at least partly intermixed; and
any two adjacent layers of the stack are at least partly intermixed;
wherein the ohmic contact comprises the annealed stack.

14. The method according to claim 13, wherein:
annealing comprises:
annealing the device at a first temperature that is between 220 C and 300 C, so as for the one of the four layers in contact with the n-doped InP layer to react therewith and form a region comprising a NiInP compound; and
annealing the device at a second temperature that is higher than the first temperature and lower than or equal to 450 C, such that any two adjacent layers of the stack are at least partly intermixed.

15. The method according to claim 14, wherein growing comprises growing two stacks of alternating layers, each of the two stacks according to the stack of four alternating layers of Si and Ni, such that one of the four layers in each of the two stacks that is in contact with the n-doped InP layer is a layer of Ni.

16. The method according to claim 15, wherein the method further comprises, after providing the n-doped InP layer and prior to growing the stack of alternating layers:
growing a stack of III-V semiconductor material layers, on top and in contact with the n-doped InP layer, and a p-doped InP layer on top and in contact with a top layer of the stack of III-V semiconductor material layers;
covering the n-doped InP layer and the p-doped InP layer on top of the stack of III-V semiconductor material layers with a cladding material; and
opening vias in the cladding material on each side of the stack of III-V semiconductor material layers,
wherein, the two stacks of alternating layers are grown in the vias, respectively.

* * * * *